United States Patent
Hong et al.

(10) Patent No.: US 10,236,404 B2
(45) Date of Patent: Mar. 19, 2019

(54) BACK SHEET AND SOLAR CELL MODULE INCLUDING THE SAME

(71) Applicant: LG ELECTRONICS INC., Seoul (KR)

(72) Inventors: Seeun Hong, Seoul (KR); Byongsu Kim, Seoul (KR); Hwanyeon Kim, Seoul (KR); Youngsik Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/444,525

(22) Filed: Jul. 28, 2014

(65) Prior Publication Data

US 2015/0027535 A1 Jan. 29, 2015

(30) Foreign Application Priority Data

Jul. 29, 2013 (KR) .................. 10-2013-0089687

(51) Int. Cl.
*H01L 31/00* (2006.01)
*H01L 31/054* (2014.01)
*H01L 31/049* (2014.01)

(52) U.S. Cl.
CPC ........ *H01L 31/0547* (2014.12); *H01L 31/049* (2014.12); *Y02E 10/52* (2013.01)

(58) Field of Classification Search
CPC ............. H01L 31/0487; H01L 31/0547; H01L 31/049
See application file for complete search history.

(56) References Cited

U.S. PATENT DOCUMENTS

| 2001/0045505 A1* | 11/2001 | Morizane ............... B32B 17/10 250/200 |
| 2006/0272698 A1* | 12/2006 | Durvasula ..................... 136/246 |
| 2007/0046197 A1* | 3/2007 | Anderson ............ C09K 11/584 313/509 |
| 2008/0185033 A1* | 8/2008 | Kalejs ........................... 136/246 |
| 2009/0242020 A1* | 10/2009 | Myong ............. H01L 31/02167 136/255 |
| 2010/0043871 A1* | 2/2010 | Xia ......................... B29C 70/58 136/251 |
| 2010/0139749 A1* | 6/2010 | Mapel ..................... C03C 3/102 136/255 |
| 2011/0105681 A1* | 5/2011 | Nishijima .............. C08K 5/544 524/588 |
| 2011/0297222 A1* | 12/2011 | Takegami ..................... 136/256 |
| 2011/0315189 A1* | 12/2011 | Ge ............................ B32B 7/12 136/244 |
| 2012/0273024 A1* | 11/2012 | Ko et al. ....................... 136/246 |
| 2013/0026593 A1* | 1/2013 | Hermans et al. ............. 257/432 |

FOREIGN PATENT DOCUMENTS

WO WO2012154803 * 11/2012 ............ H01L 31/00

OTHER PUBLICATIONS thefreedictionary.com, "Resin definition".*

* cited by examiner

*Primary Examiner* — Angelo Trivisonno
(74) *Attorney, Agent, or Firm* — Birch, Stewart, Kolasch & Birch, LLP

(57) ABSTRACT

Discussed is a back sheet for a solar cell module. The back sheet includes a base member and a first layer formed on one surface of the base member, the first layer including a resin. A reflector is formed in at least a portion of the back sheet.

10 Claims, 8 Drawing Sheets

BACK SHEET AND SOLAR CELL MODULE INCLUDING THE SAME

CROSS-REFERENCE TO RELATED APPLICATION

This application claims the priority benefit of Korean Patent Application No. 10-2013-0089687, filed on Jul. 29, 2013 in the Korean Intellectual Property Office, the disclosure of which is incorporated herein by reference.

BACKGROUND OF THE INVENTION

1. Field of the Invention

The embodiments of the invention relate to a back sheet and a solar cell module including the same and, more particularly, to a back sheet having an improved structure and a solar cell module including the same.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Such solar cells are fabricated into a module form by a packaging process for protection of solar cells because solar cells must withstand exposure to an external environment for a long time. In particular, a back substrate included in a solar cell module serves to protect solar cells from moisture or the likes of air and to protect a sealing material used to seal the solar cells from ultraviolet light. Thus, the back substrate is a factor that has an effect on properties of the solar cell module.

Conventionally, the back substrate or sheet of the solar cell module merely protects, waterproofs and electrically insulates the solar cell and the like and does nothing to enhance the output of the solar cell module.

SUMMARY OF THE INVENTION

Therefore, embodiments of the invention have been made in view of the above problems, and it is an object of the embodiments of the invention to provide a back sheet which is capable of enhancing the output of a solar cell module and a solar cell module including the same.

In accordance with one embodiment of the invention, the above and other objects can be accomplished by the provision of a back sheet for a solar cell module, the back sheet including a base member, a first layer formed on one surface of the base member, the first layer including a resin, and a reflector formed in at least a portion of the back sheet.

In accordance with another embodiment of the invention, there is provided a solar cell module including a solar cell and a back sheet attached to the solar cell. The back sheet includes a base member, a first layer formed on one surface of the base member, the first layer including a resin, and a reflector formed in at least a portion of the back sheet.

BRIEF DESCRIPTION OF THE DRAWINGS

The above and other objects, features and other advantages of the embodiments of the invention will be more clearly understood from the following detailed description taken in conjunction with the accompanying drawings, in which.

DETAILED DESCRIPTION OF THE EMBODIMENTS

Reference will now be made in detail to the embodiments of the invention, examples of which are illustrated in the accompanying drawings. However, it will be understood that the invention should not be limited to the embodiments and may be modified in various ways.

In the drawings, to clearly and briefly explain the invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the embodiments of the invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell module according to the embodiments of the invention will be described in detail with reference to the accompanying drawings.

Figure 1:
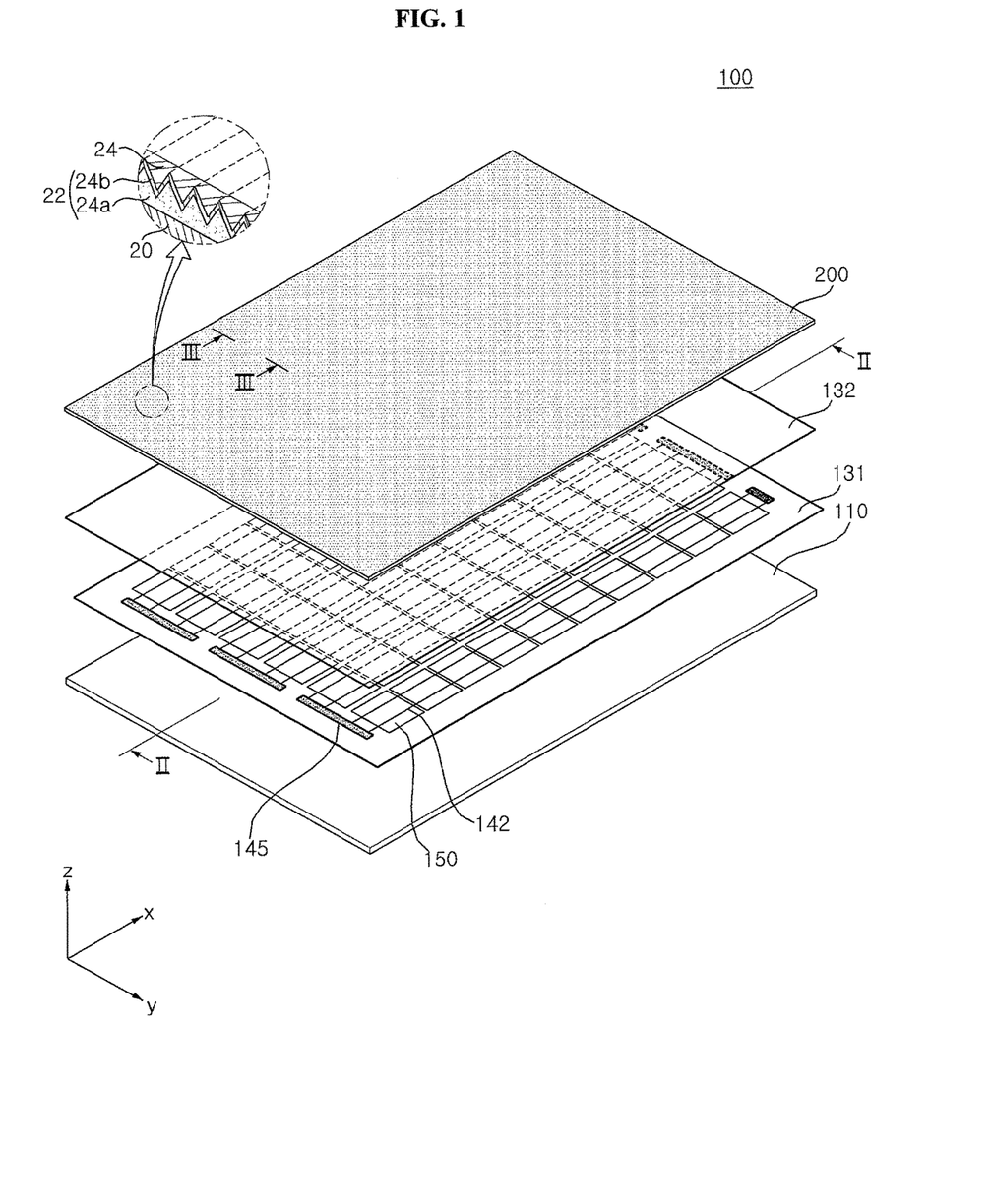
FIG. 1 is an exploded perspective view showing a solar cell module according to one embodiment of the invention.
Figure 2:
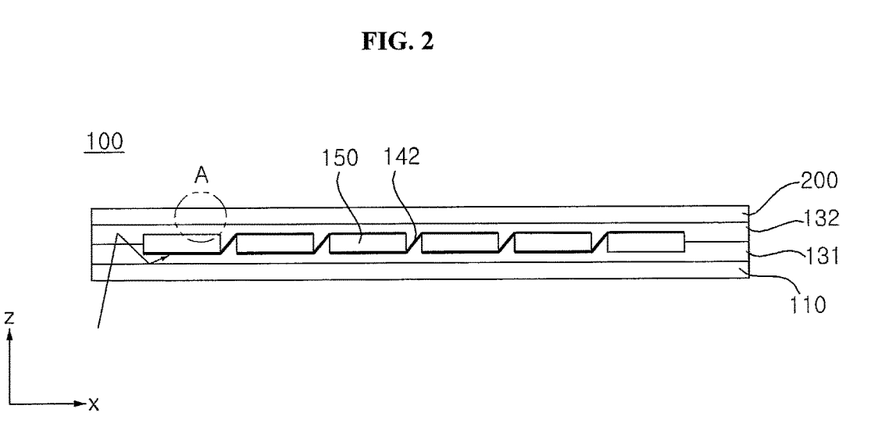
FIG. 2 is a sectional view of the solar cell module taken along line II-II of FIG. 1.

FIG. 1 is an exploded perspective view showing a solar cell module according to one embodiment of the invention and FIG. 2 is a sectional view of the solar cell module taken along line II-II of FIG. 1.

Referring to FIGS. 1 and 2, the solar cell module, designated by reference numeral 100, according to one embodiment of the invention may include solar cells 150, a first substrate 110 disposed at the front of the solar cells 150 (hereinafter referred to as "front substrate") and a second substrate 200 disposed at the back of the solar cells 150 (hereinafter referred to as "back sheet"). In addition, the solar cell module 100 may include a first sealing material 131 between the solar cells 150 and the front substrate 110 and a second sealing material 132 between the solar cells 150 and the back sheet 200.

First, each of the solar cells 150 includes a photoelectric converter to convert sunlight into electrical energy and an electrode electrically connected to the photoelectric converter. In the embodiment of the invention, for example, the photoelectric converter may include a semiconductor substrate (e.g., silicon substrate) and a dopant layer. However, the embodiments of the invention are not limited thereto and various other structures of photoelectric converters using a compound semiconductor, a dye sensitized material or the like may be used.

The solar cells 150 may include ribbons 142 and be electrically connected to one another in series, in parallel or in combinations thereof using the ribbons 142. More specifically, the ribbons 142 may interconnect a front electrode formed on a light receiving surface of one solar cell 150 and a back electrode formed on a back surface of another adjacent solar cell 150 via a tabbing process. The tabbing process may be performed by applying flux to one surface of the solar cell 150, positioning the ribbon 142 on the solar cell 150 to which the flux has been applied and then firing the same. The flux serves to remove an oxide film that prevents soldering and may be omitted as needed.

Alternatively, a conductive film may be attached between one surface of each solar cell 150 and the ribbon 142 and, thereafter, the solar cells 150 may be interconnected in series or in parallel via thermal compression. The conductive film may be formed by distributing conductive particles, such as highly conductive gold, silver, nickel, copper particles and the like, in a film formed of epoxy resin, acryl resin, polyimide resin, polycarbonate resin and the like. When heat and pressure are applied to the conductive film, the conductive particles are exposed outward of the conductive film, thus electrically connecting the solar cells 150 and the ribbons 142 to each other. In the instance in which the solar cells 150 are interconnected into a module by the conductive film as described above, a process temperature may be lowered and, consequently, this may prevent bending of the solar cells 150.

In addition, bus ribbons 145 are used to alternately interconnect ends of the ribbons 142 each interconnecting the solar cells 150 arranged in a single row. The bus ribbons 145 may be arranged at an end of each row of the solar cells 150 and be perpendicular to the solar cells 150. The bus ribbons 145 are connected to a junction box that collects electricity produced by the solar cells 150 and prevents backflow of electricity.

The first sealing material 131 may be disposed on light receiving surfaces of the solar cells 150 and the second sealing material 132 may be disposed on back surfaces of the solar cells 150. The first sealing material 131 and the second sealing material 132 are attached via lamination and serve not only to block moisture or oxygen that may have a negative effect on the solar cells 150, but also to achieve chemical bonding of constituent elements of the solar cells 150.

The first sealing material 131 and the second sealing material 132 may be ethylene vinyl acetate (EVA) copolymer resin, polyvinyl butyral, silicone resin, ester-based resin, olefin-based resin and the like. However, the embodiments of the invention are not limited thereto. Thus, the first and second sealing materials 131 and 132 may be one or more various other materials and may be formed via various other methods rather than lamination.

The front substrate 110 is disposed on the first sealing material 131 to transmit sunlight. Preferably, but not necessarily, the front substrate 110 is tempered glass to protect the solar cells 150 from external shock and the like. Additionally, low-iron tempered glass containing a low amount of iron may be used to prevent reflection of sunlight and to increase transmittance of sunlight. However, the embodiments of the invention are not limited thereto and the front substrate 110 may be formed of various other materials.

The back sheet 200 is a layer to protect the solar cells 150 at the back of the solar cells 150 and has waterproofing, electrical insulation and anti-ultraviolet functions. The back sheet 200 may take the form of a film or sheet, for example. Hereinafter, a structure of the back sheet 200 will be described in detail with reference to FIG. 3 in conjunction with the enlarged circle of FIG. 1.

Figure 3:
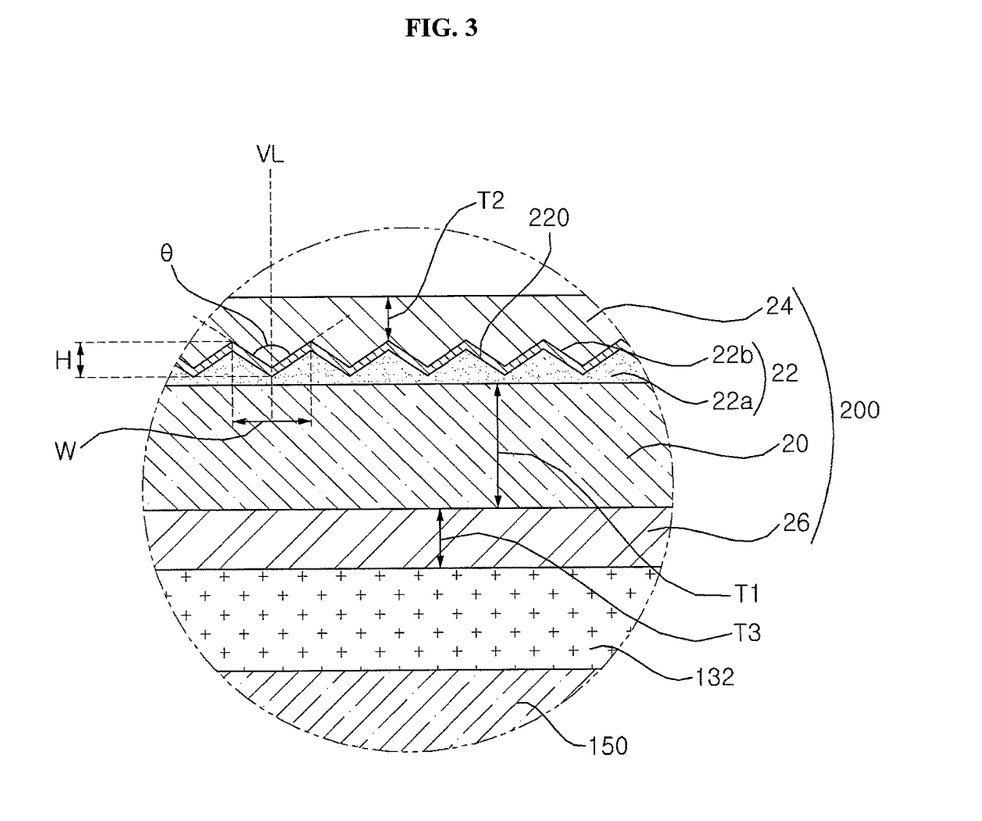
FIG. 3 is an enlarged partial sectional view taken along line of FIG. 1 showing a back sheet included in the solar cell module of FIG. 1.

FIG. 3 is an enlarged partial sectional view taken along line of FIG. 1 showing the back sheet 200 included in the solar cell module of FIG. 1.

Referring to FIG. 3, the back sheet 200 according to the embodiment of the invention includes a base member 20, a first layer 24 formed on one surface of the base member 20 and a second layer 26 formed on the other surface of the base member 20. In this instance, a reflector 22 is formed between the first layer 24 and the base member 20 to enhance reflection efficiency of the back sheet 200. This will be described below in more detail.

The base member 20 serves to support the first and second layers 24 and 26 and the reflector 22. The base member 20 may be formed of polyester, for example. Polyester has excellent mechanical, thermal and electrical properties as well as high moldability, chemical resistance and the like and, thus, is suitable to protect the solar cells 150.

In this instance, the polyester may be a general polyester or a hydrolysis resistant polyester. The general polyester may cause deterioration of mechanical properties due to hydrolysis when used for a long time. For this reason, the hydrolysis resistant polyester may be used. The hydrolysis resistant polyester may be prepared by adding various hydrolysis reduction materials (e.g., alkali metal or alkali earth metal, such as phosphate, inorganic phosphate or appropriate oligomer) to the polyester. Alternatively, the hydrolysis resistant polyester may be prepared by adjusting a molecular weight of polyester. In this instance, the molecular weight of hydrolysis resistant polyester may be within a range of approximately 8,000 to 10,000. The base member 20 formed of the general polyester (having a molecular weight of approximately 6,000 to 8,000) or the hydrolysis resistant polyester may take the form of various known films, sheets and the like.

In this instance, polyester may include polyethylene terephthalate (PET). Polyethylene terephthalate is a saturated polyester resin acquired by condensation reaction of terephthalic acid (HOOC—COOH) and ethylene glycol and has excellent heat resistance, weather resistance, electrical insulation, mechanical strength and the like. In particular, polyethylene terephthalate has low molding shrinkage of 0.1%~0.6% and may prevent thermal deformation of the back sheet 200.

The base member 20 may have a thickness T1 ranging from 50 μm to 350 μm. When the thickness T1 of the base member 20 is below 50 μm, the base member 20 may have difficulty in achieving sufficient electrical insulation, moisture-proofing and mechanical properties. When the thickness T1 of the base member 20 exceeds 350 μm, the base member 20 may cause inconvenience in handling and increased cost. However, the embodiments of the invention are not limited to the above-described thickness range of the base member 20.

The base member 20 may be transparent. However, the embodiments of the invention are not limited thereto and a white pigment may be added to the base member 20 to make the base member 20 white. Various other alterations are possible.

In the embodiment of the invention, the reflector 22 is formed on one surface of the base member 20 (i.e. between the base member 20 and the first layer 24). The reflector 22 according to the embodiment of the invention may include a ridged portion 22a protruding from the base member 20 and located between the base member 20 and the first layer 24, the ridged portion 22a having ridges (protrusions and/or indentations) 220, and a reflective film 22b formed on the ridged portion 22a.

The ridged portion 22a is provided with the ridges 220 at one surface thereof opposite to the base member 20 (i.e. one surface close to the first layer 24). The ridges 220 may define a plurality of grooves each having at least one slope therebetween. The slopes of the ridges 220 may cause diffuse reflection and scattering of light.

In one example, the grooves between the ridges 220 respectively may have two adjacent slopes arranged in a given direction by a long length and may take the form of a notch having a V-shaped cross section. In this instance, referring to the enlarged circle of FIG. 1, the grooves between the ridges 220 may extend to a long length in a longitudinal direction of a solar cell string (this refers to the solar cells 150 interconnected by the ribbons 142 to constitute a single row). As such, all faces of the ridges 220 may be slopes, which may result in enhanced diffuse reflection and scattering of light. In addition, the ridges 220 having a simplified structure may be easily prepared, which may result in a simplified manufacturing process.

In one example, an angle (inclination angle) θ between two neighboring slopes may be within a range of 5 degrees to 150 degrees. When the inclination angle θ is below 5 degrees or exceeds 150 degrees, diffuse reflection and scattering of light by the slopes may be deteriorated. In this instance, the two neighboring slopes may be symmetrically located on the basis of a direction perpendicular to the solar cell module 100 (i.e. a virtual line VL extending in a vertical direction in the drawing). This enables more uniform diffuse reflection and scattering of light. However, the embodiments of the invention are not limited thereto and the inclination angle θ may be changed.

A depth H of the grooves between the ridges 220 (or a height of the ridges 220) may be within a range of 10 μm to 150 μm. When the depth H of the grooves is below 10 μm, less diffuse reflection and scattering of light may occur. When the depth H of the grooves exceeds 150 μm, the back sheet 200 may be excessively thick. In consideration of a thickness of the back sheet 200, the depth H of the grooves may be within a range of 10 μm to 50 μm. However, the embodiments of the invention are not limited thereto and the depth H of the grooves may be changed.

A width W of the grooves between the ridges 220 (i.e. a distance between two neighboring slopes) may be within a range of 10 μm to 2,000 μm. When the width W of the grooves exceeds this range, it may be difficult to provide the grooves with a given level of depth H and a desired inclination angle θ. In consideration of the depth H and the inclination angle θ of the grooves, the width W of the grooves may be within a range of 10 μm to 500 μm. However, the embodiments of the invention are not limited thereto and the width W of the grooves may be changed.

The ridged portion 22a having the above-described shape may be formed of a curable resin. More specifically, the ridged portion 22a may be formed by applying a curable resin to the base member 20 via gravure coating or the like such that the ridges 220 are formed on the base member 20 and, then, curing the same. However, the embodiments of the invention are not limited thereto. Alternatively, the curable resin may be applied such that no ridges 220 are formed and, thereafter, may be subjected to patterning (e.g., molding, etching or the like) before or after curing to form the ridges 220.

It may be difficult to provide the base member 20 with the ridges 220 having the above-described shape by etching or the like. Providing the ridged portion 22a according to the embodiment of the invention may allow a desired shape of the ridges 220 to be easily formed on one surface of the base member 22.

The reflective film 22b may be applied over the entire ridged portion 22a (i.e. over the ridges 220). The reflective film 22b may assist more effective diffuse reflection and scattering of light. The reflective film 22b may be formed of a metal having high reflectance (e.g., aluminum). The reflective film 22b formed of aluminum may enhance reflection efficiency owing to high reflectance thereof and prevent outside moisture from entering the solar cells 150 owing to low moisture permeability thereof, thereby contributing to further enhancement in the properties of the solar cell module 100.

In this instance, upper and lower surfaces of the reflective film 22b have ridges corresponding to the shape of the ridges 220 of the ridged portion 22a. That is, the reflective film 22b may have ridges having a depth ranging from 10 μm to 150 μm (more specifically ranging from 10 μm to 50 μm) similar to the ridged portion 22a.

In one example, a thickness of the reflective film 22b may be within a range of 10 μm to 50 μm. When the thickness of the reflective film 22b is below 10 μm, the reflective film 22b may not provide sufficient results. When the thickness of the reflective film 22b exceeds 50 μm, this may cause increased material costs and manufacturing process time. However, the embodiments of the invention are not limited thereto and the reflective film 22b may have various other thicknesses.

The reflective film 22b may be formed over the entire ridged portion 22a. In one example, the reflective film 22b may be formed by deposition and the like. However, the embodiments of the invention are not limited thereto and the reflective film 22b may be formed over a portion of the ridged portion 22a and various alterations with regard to formation of the reflective film 22b are possible.

In the embodiment of the invention, the reflector 22 may achieve diffuse reflection and scattering of light by the back sheet 200, thereby allowing light directed from the solar cells 150 to the back sheet 200 to be reflected to the solar cells 150. This may increase the quantity of light used for photoelectric conversion by the solar cells 150, thereby contributing to enhancement in the efficiency of the solar cells 150. In this instance, the reflector 22 includes the ridged portion 22a and the reflective film 22b formed over the ridged portion 22a, to achieve enhanced reflection effects. That is, combination of the ridges 220 of the ridged portion 22a and the reflective film 22b may maximize reflection effects.

In the embodiment of the invention, the reflector 22 and the first layer 24 may be located on one surface of the base member 20 opposite to the solar cells 150 (i.e. an outer surface of the solar cell module 100). As such, the first layer 24 may have a relatively large thickness, thus achieving efficient electrical insulation between the solar cell module 100 and the outside. However, the embodiments of the invention are not limited thereto and the reflector 22 and the first layer 24 may be located on the other surface of the base member 20 facing the solar cells 150. This embodiment of the invention will be described below in detail with reference to FIG. 4.

In addition, in the embodiment of the invention, the reflector 22 may be formed in the entire back sheet 200. Providing the entire back sheet 200 with the reflector 22 may maximize reflection efficiency. Moreover, an additional process for patterning of the reflector 22 may be omitted. However, the embodiments of the invention are not limited thereto and the reflector 22 may be formed in a portion of the back sheet 200. This embodiment of the invention will be described below in detail with reference to FIGS. 5 to 7.

The first layer 24, which is formed on one surface of the base member 20 (in the embodiment of the invention, on the reflector 22), may comprise a resin and an adhesive material and further comprise a pigment, a heat resistance material, a dispersing agent and the like.

The resin may be poly vinylidene fluoride (PVDF). Poly vinylidene fluoride is a polymer having a structure of $(CH_2CF_2)n$ and has double fluorine bonds, thus exhibiting excellent mechanical properties, weather resistance and ultraviolet resistance.

The adhesive material may be a material capable of stably attaching and fixing the first layer 24 to the base member 20 (more accurately, in the embodiment of the invention, to the reflector 22 formed on the base member 20). In one example, the adhesive material may be an acryl-based adhesive material. However, the embodiments of the invention are not limited thereto and various other adhesive materials may be used.

The first layer 24 may further comprise the pigment and the like when it is desired to adjust color. For example, the pigment may be a white pigment or a black pigment. In addition, when the first layer 24 comprises the heat resistance material, surface heat resistance may be enhanced, which may prevent a temperature of the solar cell module 100 from being increased due to light introduced by ground reflection and the like. The heat resistance material may be selected from various materials having excellent heat resistance. For example, the heat resistance material may include a silicon oxide (silica). In addition, the first layer 24 may further comprise the dispersing agent for distribution of the resin, the adhesive material, the pigment and the heat resistance material. The pigment and the dispersing agent may be selected from among various materials.

The first layer 24 as described above may be formed by mixing the resin, the adhesive material, the pigment, the dispersing agent and the like with one another, applying the mixture to the base member 20 and the reflector 22 and performing thermal treatment and/or drying upon the applied mixture. To this end, various mixing, application, thermal treatment and/or drying methods may be used. For example, milling or the like may be used as a mixing method, and air knife coating, dip coating, curtain coating, reverse roll coating, gravure coating, metering rod coating, slot die coating or the like may be used as an application method. The thermal treatment and/or the drying may be performed at a temperature of 120° C. to 170° C. for a time from 30 seconds to 5 minutes. The aforementioned temperature and time of the thermal treatment and/or the drying are given to ensure stable formation of the first layer 24 on the base member 20, but the embodiments of the invention are not limited thereto.

A thickness T2 of the first layer 24 may be less than the thickness T1 of the base member 20. In this instance, the thickness T2 of the first layer 24 may vary according to the height of the ridges 220 at each portion. That is, since the first layer 24 has a flat back surface, the first layer 24 may have a relatively small thickness at a portion where the ridges 220 have a high height and have a relatively large thickness at a portion where the ridges 220 have a low height. For example, a minimum thickness of the first layer 24 (i.e. the thickness T2 of the first layer 24 at a portion where the ridges 220 have a maximum height) may be within a range of 1 μm to 50 μm. When the minimum thickness of the first layer 24 is below 1 μm, the first layer 24 may not provide sufficient results and have difficulty in achieving excellent adhesion properties. When the minimum thickness of the first layer 24 exceeds 50 μm, this may result in increased thickness and material costs. However, the embodiments of the invention are not limited to the above-described range of the thickness T2 of the first layer 24. In addition, a maximum thickness of the first layer 24 may be greater than a thickness of the second layer 26. As such, the first layer 24 may firmly maintain and protect the ridges 220 of the reflector 22 and provide the back sheet 200 with a flat back surface. In addition, the first layer 24 may enhance electrical insulation between the back sheet 200 and the outside.

The second layer 26 is formed on the other surface of the base member 20 (i.e. the surface facing the solar cells 150). Here, the second layer 26 may comprise a resin and an adhesive material and further comprise a pigment, a dispersing agent and the like.

The resin may be poly vinylidene fluoride. Poly vinylidene fluoride has excellent mechanical properties, weather resistance and ultraviolet resistance.

The adhesive material may be selected from among various materials that are capable of stably attaching and fixing the second layer 26 to the base member 20 and achieve high adhesive force with respect to the second sealing material 132. In one example, the adhesive material may be an acryl-based adhesive material that has high adhesive force with respect to the second sealing material 132. However, the embodiments of the invention are not limited thereto and various other adhesive materials may be used as the adhesive material.

In this instance, the quantity of the adhesive material of the second layer 26 may be equal to or greater than the quantity of the adhesive material of the first layer 24. This is because the second layer 26 is a layer attached to the second sealing material 132 and requires excellent adhesion properties, whereas the first layer 24 is not a layer attached to the first sealing material 131 and/or the second sealing material 132.

The second layer 26 may further comprise the pigment and the like when it is desired to adjust color. For example, the pigment may be a white pigment or a black pigment. In addition, the second layer 26 may further comprise the dispersing agent and the like for distribution of the resin, the adhesive material, the pigment and the like. The pigment and the dispersing agent may be selected from among various materials.

The second layer 26 as described above may be formed by mixing the resin, the adhesive material, the pigment, the dispersing agent and the like with one another, applying the mixture to the base member 20 and then performing thermal treatment and/or drying upon the applied mixture. To this end, various mixing, application, thermal treatment and/or drying methods may be used. The mixing, application, thermal treatment and/or drying methods applied to the second layer 26 are identical or extremely similar to the mixing, application, thermal treatment and/or drying methods applied to the first layer and, thus, a detailed description thereof will be omitted below.

A thickness T3 of the second layer 26 may be less than the thickness T1 of the base member 20. For example, the thickness T3 of the second layer 26 may be within a range of 1 μm to 50 μm. When the thickness T3 of the second layer 26 is below 1 μm, the second layer 26 may not provide sufficient results. When the thickness T3 of the second layer 26 exceeds 50 μm, this may result in excessively increased thickness and material costs. However, the embodiments of the invention are not limited to the above-described range of the thickness T3 of the second layer 26.

In the embodiment of the invention, the first and second layers 24 and 26 may be coating layers directly formed on the base member 20 so as to come into contact with the base member 20. As such, there is no need to use an additional adhesive layer, which may reduce material costs and simplify a manufacturing process. In addition, elimination of the adhesive layer causes less peel off between the base member 20 and the first and second layers 24 and 26.

On the other hand, a conventional back sheet has been fabricated by applying an adhesive including polyurethane or acryl to a base film and then laminating a polyvinyl fluoride (PVF) film thereon. The polyvinyl fluoride film causes expensive material costs and additionally requires material costs for an adhesive as well as an adhesive layer application process. In addition, it is necessary to attach the polyvinyl fluoride film to one side of the base film via lamination and thereafter attach the polyvinyl fluoride film to the other side of the base film. The conventional back sheet as described above suffers from high manufacture cost due to material costs and a complicated process. In addition, provision of various layers (e.g., the adhesive layer and the polyvinyl fluoride film) may cause peel off therebetween.

As described above, the back sheet 200 according to the embodiment of the invention may include the reflector to enable reflection by the back sheet 200, thereby maximizing reuse of light. This may enhance electricity generation efficiency of the solar cell module 100.

Hereinafter, the embodiments of the invention will be described in more detail with reference to other embodiments of the invention. A detailed description of the same or similar parts to those of the above-described embodiment of the invention will be omitted and only different parts will be described below in detail.

Figure 4:
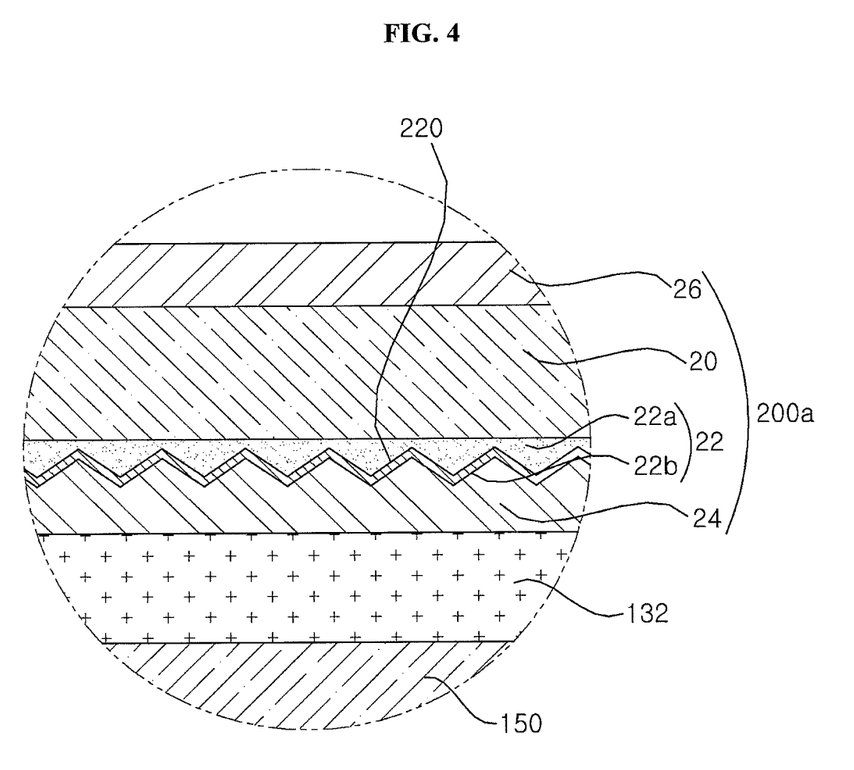
FIG. 4 is an enlarged partial sectional view showing a back sheet of a solar cell module according to another embodiment of the invention.

FIG. 4 is an enlarged partial sectional view showing a back sheet of a solar cell module according to another embodiment of the invention. Parts shown in FIG. 4 correspond to parts shown in FIG. 3.

Referring to FIG. 4, in a back sheet 200a according to the embodiment of the invention, the reflector 22 and the first layer 24 are located on a surface of the base member 20 facing the solar cells 150 and the second layer is located on an opposite outer surface of the base member 20.

In this instance, since the first layer 24 is located on the surface of the base member 20 facing the solar cells 150 to come into contact with the second sealing material 132 and the second layer 26 is located opposite to the solar cells 150, the first and second layers 24 and 26 may be formed of different materials from those in the above-described embodiment of the invention with reference to FIGS. 1 to 3.

That is, the first layer may comprise a resin and an adhesive material and further comprise a pigment, a dispersing agent and the like. In addition, the second layer 26 may comprise a resin and an adhesive material and further comprise a pigment, a heat resistance material, a dispersing agent and the like.

In the instance in which the reflector 22 and the first layer 24 are located to face the solar cells 150 as in the embodiment of the invention, a movement distance of light in the back sheet 200a may be reduced. That is, in the embodiment of the invention with reference to FIGS. 1 to 3, light having passed through the second layer 26 and the base member 20 is reflected by the reflector 22 to thereby again pass through the base member 20 and the second layer 26, thereby reaching the solar cells 150. On the other hand, in the embodiment of the invention, light having passed through the first layer 24 is reflected by the reflector 22 to thereby again pass through the first layer 24, thereby reaching the solar cells 150. That is, the embodiment of the invention may reduce a movement path of light in the back sheet 200a to minimize loss of light during movement of light. As such, it is possible to maximize the quantity of light to be reflected by the back sheet 200a and reused in the solar cells 150. This may result in enhanced electricity generation efficiency of the solar cell module 100.

Figure 5:
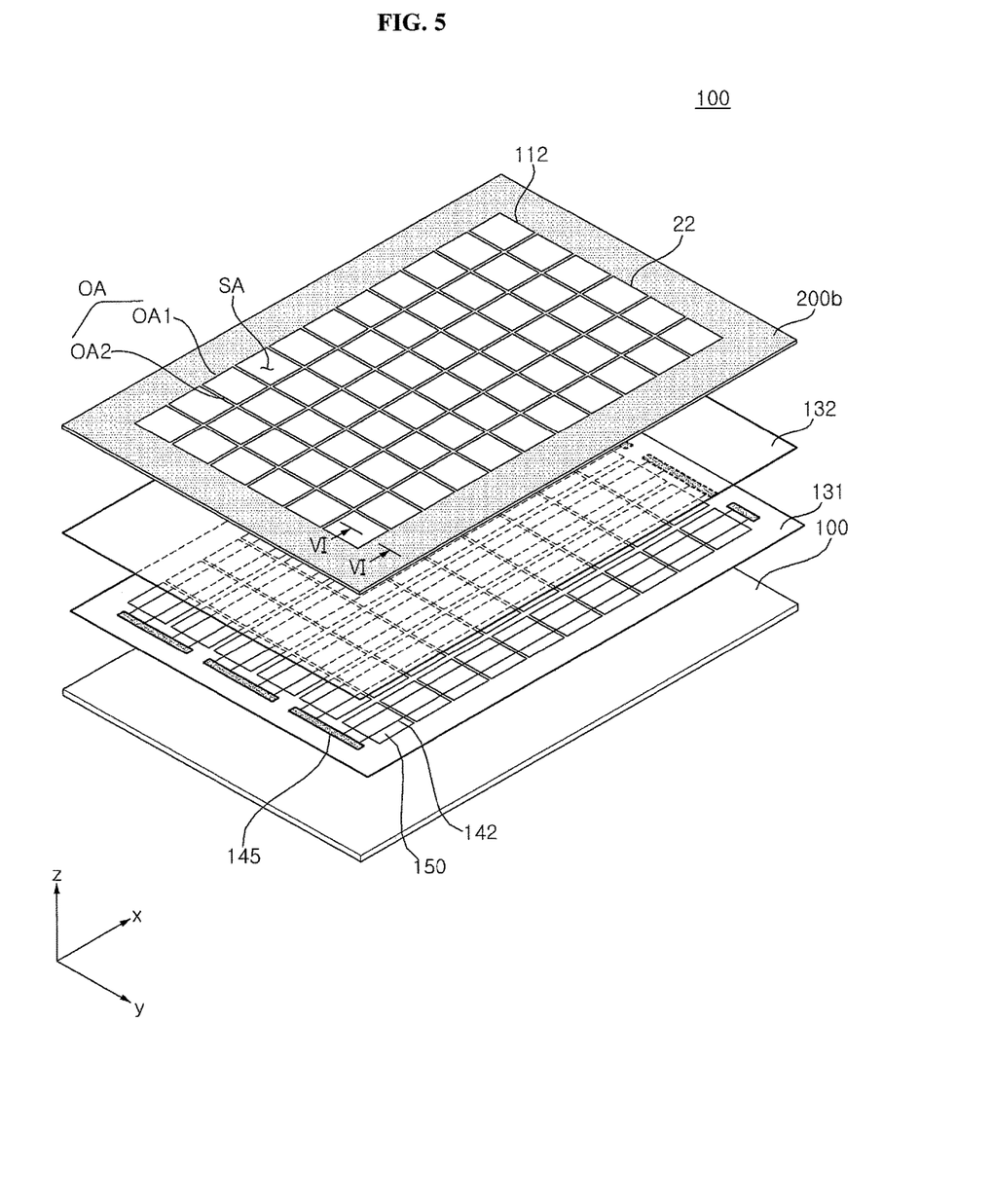
FIG. 5 is an exploded perspective view showing a solar cell module according to still another embodiment of the invention.
Figure 6:
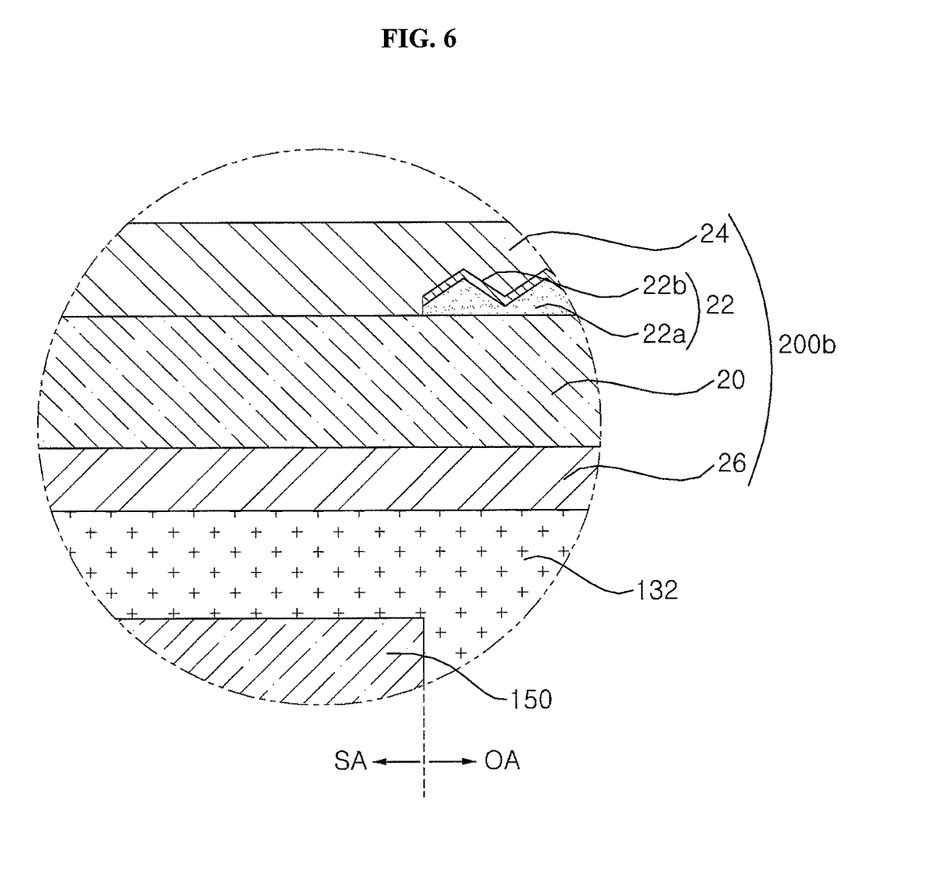
FIG. 6 is an enlarged partial sectional view taken along line VI-VI of FIG. 5 showing a back sheet included in the solar cell module of FIG. 5.

FIG. 5 is an exploded perspective view showing a solar cell module according to still another embodiment of the invention, and FIG. 6 is an enlarged partial sectional view taken along line VI-VI of FIG. 5 showing a back sheet included in the solar cell module of FIG. 5. Parts shown in FIG. 6 correspond to parts shown in FIG. 3.

Referring to FIGS. 5 and 6, the back sheet 200b according to the embodiment of the invention includes a solar cell area SA corresponding to the solar cells 150 in which photoelectric conversion occurs when light is introduced, and an outskirt area OA located at the outskirt of the solar cell area SA, the outskirt area OA corresponding to an area in which photoelectric conversion cannot occur even if light is introduced. Here, the outskirt area OA may include a first outskirt area OA1 which is formed at the perimeter of the solar cell module 100 to extend along an edge of the back sheet 200b and a second outskirt area OA2 located between the neighboring solar cells 150. The second outskirt area OA2 may have a lattice form.

In the embodiment of the invention, the reflector 22 is formed in at least a portion of the outskirt area OA of the back sheet 200b and is not formed in the solar cell area SA. As such, the solar cell area SA transmits light emitted from the back side thereof to allow the light to be used in photoelectric conversion by the solar cells 150. Since light emitted from the back side to pass through the outskirt area OA has difficulty in reaching the solar cells 150, the reflector 22 is provided at the outskirt area OA to reflect light introduced from the front side so as to allow the light to reach the solar cells 150. The reflector 22 has a plurality of slopes at which a movement path of light is changed and, therefore, may reflect light so as to reach the solar cells 150.

In this way, the embodiment of the invention may increase the quantity of light to reach the solar cells 150 as the solar cell area SA transmits light from the back side and the outskirt area OA reflects light from the front side. This may result in the maximized quantity of light reaching the solar cells 150 and, consequently, enhanced electricity generation efficiency of the solar cell module 100.

Although the drawing illustrates the reflector 22 as being formed throughout the outskirt area OA (i.e. throughout the first outskirt area OA1 and the second outskirt area OA2), the embodiments of the invention are not limited thereto. Thus, the reflector 22 may be formed only in a portion of the outskirt area OA. For example, the reflector 22 may be formed only in the first outskirt area OA1 and not formed in the second outskirt area OA2. Alternatively, the reflector 22 may be formed only in the second outskirt area OA2 and not formed in the first outskirt area OA1. In other embodiments of the invention, an edge of the reflector 22 may intrude into a small portion of the solar cell area SA.

In addition, although the drawing illustrates the reflector 22 and the first layer 24 as being located at a back surface of the solar cell module 100, the reflector 22 and the first layer 24 may be formed adjacent to the solar cells 150 as in the embodiment of the invention with reference to FIG. 4.

In addition, although the drawing illustrates that the first layer 24 in the solar cell area SA and the first layer 24 in the outskirt area OA are formed of the same material and exhibit the same properties, the first layer 24 in the solar cell area SA and the first layer 24 in the outskirt area OA may be formed of different materials and exhibit different properties. This will be described below in more detail with reference to FIG. 7. Various other alterations are possible.

Figure 7:
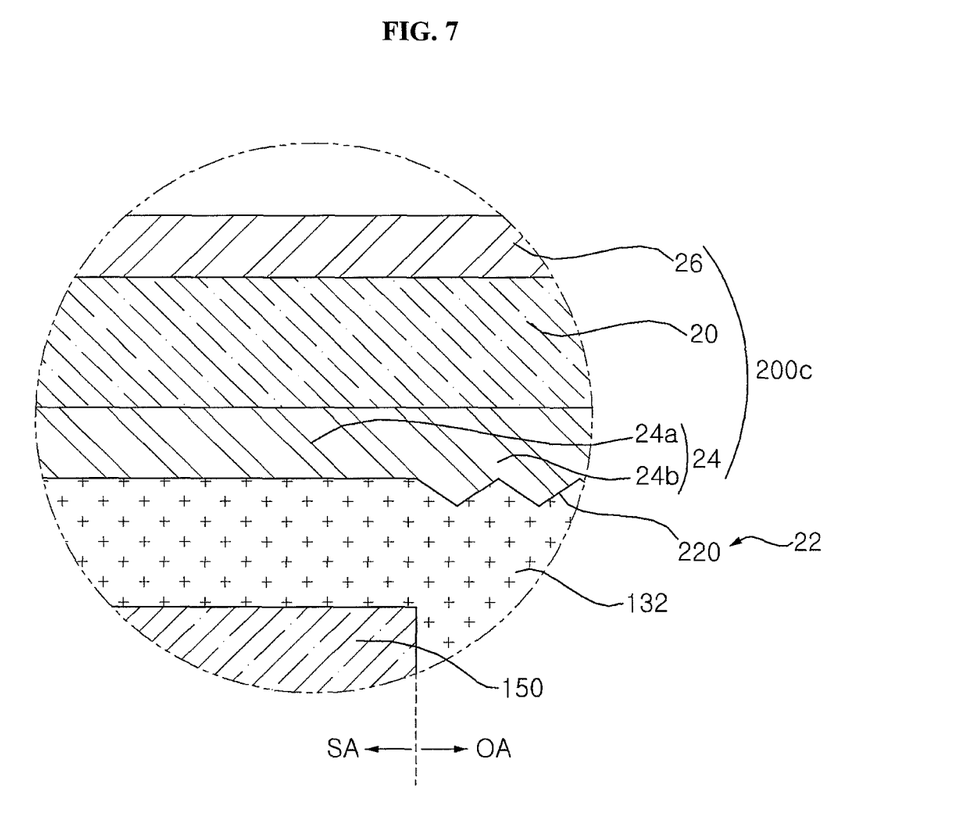
FIG. 7 is an enlarged partial sectional view showing a back sheet of a solar cell module according to a further embodiment of the invention.

FIG. 7 is an enlarged partial sectional view showing a back sheet of a solar cell module according to a further embodiment of the invention. Parts shown in FIG. 7 correspond to parts shown in FIG. 3.

Referring to FIG. 7, in the back sheet 200c according to the embodiment of the invention, the reflector 22 includes the ridges 220 formed at the first layer 24. More specifically, differently from the above-described embodiment of the invention, the reflector 22 is directly formed at the first layer 24, rather than including the ridged portion (see reference numeral 22a of FIG. 3, the same as below) and the reflective film (see reference numeral 22b of FIG. 3, the same as below). As such, reflection may be effectively induced via a simplified structure.

That is, the ridges 220 are formed at one surface of the first layer 24 opposite to the base member 20 and serve to reflect light. The embodiment of the invention illustrates that the reflector 22 including the ridges 220 is formed only in the outskirt area OA and not formed in the solar cell area SA. Thereby, as only the solar cell area SA transmits light from the back side and the outskirt area OA reflects light from the front side, a greater quantity of light may reach the solar cells 150. In other embodiments of the invention, an edge of the ridges 220 may intrude into a small portion of the solar cell area SA.

In this instance, to enhance reflection a little more, the first layer 24 may have different properties in the solar cell area SA and in the outskirt area OA. That is, the first layer 24 may include a first area 24a corresponding to the solar cell area SA and a second area 24b corresponding to the outskirt area OA and the first area 24a and the second area 24b may have different properties. For example, the first area 24a may comprise no pigment to enhance transmittance of light and, thus, be transparent, whereas the second area 24b may comprise a pigment (e.g., a white pigment) to enhance reflectance and, thus, be white. Alternatively, the second area 24b may comprise a light scattering material (e.g., beads). As such, light from the back side having passed through the first area 24a may easily reach the solar cells 150 and light from the front side reaching the second area 24b may be efficiently reflected to the solar cells 150. This may result in enhanced electricity generation efficiency of the solar cell module 100.

In the embodiment of the invention, the reflector including the ridges 220 may be located close to the solar cells 150 so as to come into contact with the second sealing material 132. As such, a contact area between the ridges 220 and the second sealing material 132 may be increased, which may result in enhanced adhesion between the reflector 22 and the second sealing material 132.

However, the embodiments of the invention are not limited to the above-described embodiment of the invention. As in the embodiment of the invention with reference to FIG. 4, the reflector 22 including the ridges 220 may be located close to the outer surface of the solar cell module 100. In addition, the reflector 22 including the ridges 220 may be formed at the entire first layer 24 and the first layer 24 may be white. In addition, the first and second areas 24a and 24b of the first layer 24 may have the same properties.

The reflector 22 may be formed throughout the outskirt area OA (i.e. throughout the first outskirt area (see reference numeral OA1 of FIG. 6, the same as below) and the second outskirt area (see reference numeral OA2 of FIG. 6, the same as below)), or may be formed only in a portion of the outskirt area OA. For example, the reflector 22 may be formed only in the first outskirt area OA1 and not formed in the second outskirt area OA2. Alternatively, the reflector 22 may be formed only in the second outskirt area OA2 and not formed in the first outskirt area OA1. Alternatively, the reflector 22 may be formed only in a portion of the first outskirt area OA1 and/or the second outskirt area OA2. Various other alterations are possible.

Although the embodiment of the invention illustrates provision of the solar cells 150, the embodiments of the invention are not limited thereto. That is, it is sufficient that the solar cell module 100 include at least one solar cell 150 of various types.

Figure 8:
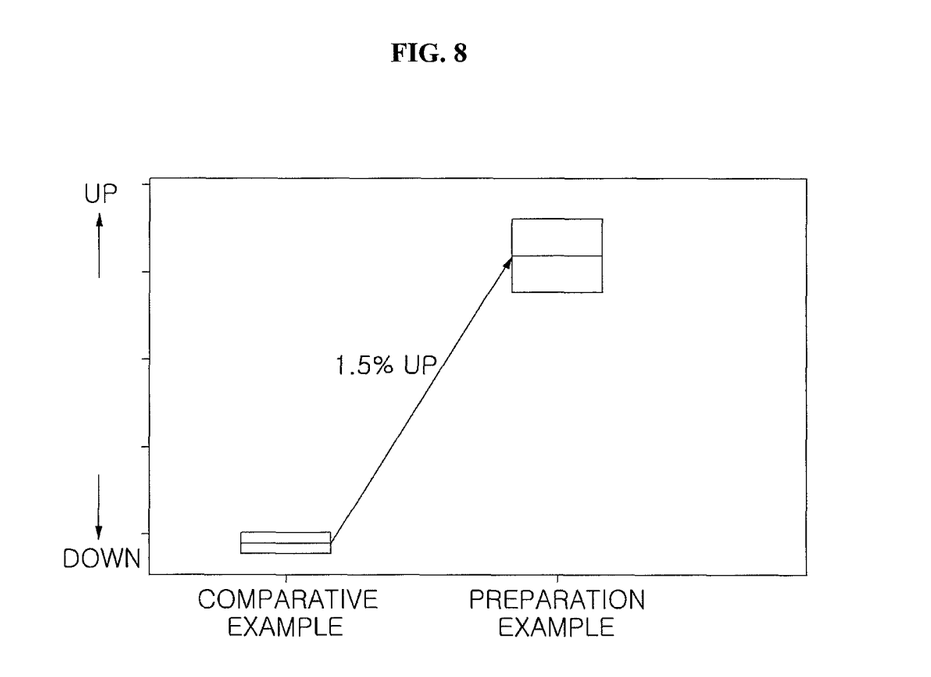
FIG. 8 is a graph showing maximum outputs of solar cell modules according to a preparation example of the invention and a comparative example.

FIG. 8 shows measured results of maximum output of solar cell modules according to a preparation example in which a back sheet includes the reflector 22 configured as shown in FIG. 3 and a comparative example in which a back sheet includes no reflector. In this instance, the back sheets according to the preparation example and the comparative example have the same structure except for the presence of the reflector.

Referring to FIG. 8, it will be appreciated that the solar cell module including the back sheet according to the preparation example has a maximum output that is 1.5% higher than that of the comparative example. This is because an increased quantity of light is reflected from the back sheet and the reflected light is reintroduced into the back sheet to thereby be used in photoelectric conversion.

The above-described embodiments of the invention illustrate that the reflector 22 includes the ridged portion 22a and the reflective film 22b formed on the ridged portion 22a, or includes the ridges 220 formed at the first layer 24. However, the reflector 22 may have various other configurations. For example, the reflector 22 may include the reflective film 22b alone, may include the ridges 220 formed at any other layer except for the first layer 24, or may include various shapes of reflective patterns to reflect light in various ways rather than the ridges 220.

As is apparent from the above description, a back sheet according to the embodiments of the invention includes a reflector to induce diffuse reflection and scattering of light. As such, the back sheet may reflect light directed from solar cells thereto, thereby causing the light to again be introduced into the solar cells. This may increase the quantity of light to be used in photoelectric conversion by the solar cells, thereby enhancing efficiency of solar cells and the output of a solar cell module.

The above-described embodiments of the invention may be combined with one another as needed and alterations of one embodiment of the invention may be applied to other embodiments of the invention.

That is, the above described features, configurations, effects, and the like are included in at least one of the embodiments of the invention, and should not be limited to only one embodiment of the invention. In addition, the features, configurations, effects, and the like as illustrated in each embodiment of the invention may be implemented with regard to other embodiments of the invention as they are combined with one another or modified by those skilled in the art. Thus, content related to these combinations and modifications should be construed as including in the scope and spirit of the invention as disclosed in the accompanying claims.

What is claimed is:

1. A solar cell module comprising:
    a plurality of solar cells;
    a front transparent glass positioned on a front side of the plurality of solar cells;
    a transparent back sheet positioned on a back side of the plurality of solar cells;
    a first sealing member positioned between the front transparent glass and the plurality of solar cells; and
    a second sealing member positioned between the transparent back sheet and the plurality of solar cells,
    wherein the transparent back sheet includes:
        a base member formed of polyester and configured to support the plurality of solar cells, wherein the base member comprises a cell side facing the plurality of solar cells and an outer side opposite to the cell side,
        a first layer formed between the second sealing member and the base member and comprising a first resin, and
        a second layer formed on the base member opposite the first layer,
    wherein the transparent back sheet for the solar cell module includes a solar cell area corresponding to a solar cell and an outskirt area located around the solar cell area,
    wherein a first portion of the first layer in the solar cell area is transparent, and a second portion of the first layer in the outskirt area includes a white pigment,
    wherein the base member is thicker than the first layer and the second layer,
    wherein a surface of the first layer in the outskirt area directly contacts the second sealing member and comprises ridges, and a reflector including a ridged portion formed on the cell side of the base member and a reflective film coated on the ridged portion, wherein the second layer comprises a second resin and forms an outermost layer of the transparent back sheet, wherein the ridged portion is a different layer than the base member and the ridged portion is located between the base member and the first layer, and wherein the first layer covers the reflector.

2. The solar cell module according to claim 1, wherein the ridges of the first layer are disposed in the outskirt area and the first portion of the first layer in the solar cell area is flat.

3. The solar cell module according to claim 1, wherein a width of grooves between the ridges of the first layer is within a range of 10 μm to 2,000 μm.

4. The solar cell module according to claim 1, wherein the first layer contacts the second sealing member sealing the plurality of solar cells.

5. The solar cell module according to claim 1, further comprising a reflector including a reflective film,
    wherein the reflective film contacts the first layer.

6. The solar cell module according to claim 1, further comprising a reflector,
    wherein the outskirt area includes a first outskirt area formed along an edge of the transparent back sheet for the solar cell module and a second outskirt area located between the plurality of solar cells, and
    wherein the reflector is formed in at least one of the first outskirt area and the second outskirt area.

7. The solar cell module according to claim 1, wherein a thickness of the base member is within a range of 50 μm to 350 μm, and
    wherein a thickness of the first layer and a thickness of the second layer are within a range of 1 μm to 50 μm.

8. The solar cell module according to claim 1, further comprising a reflector including a material for reflecting light.

9. The solar cell module according to claim 1, further comprising a reflector including a plurality of V-shaped grooves for reflecting light.

10. The solar cell module according to claim 1, further comprising a reflector including aluminum (Al).

* * * * *